(12) United States Patent
Park

(10) Patent No.: US 11,975,977 B2
(45) Date of Patent: May 7, 2024

(54) PRODUCTION METHOD OF SILICA FILM

(71) Applicant: LG Chem, Ltd., Seoul (KR)

(72) Inventor: Kwang Seung Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 1113 days.

(21) Appl. No.: 16/641,141

(22) PCT Filed: Aug. 24, 2018

(86) PCT No.: PCT/KR2018/009800
§ 371 (c)(1),
(2) Date: Feb. 21, 2020

(87) PCT Pub. No.: WO2019/039909
PCT Pub. Date: Feb. 28, 2019

(65) Prior Publication Data
US 2020/0172404 A1    Jun. 4, 2020

(30) Foreign Application Priority Data
Aug. 24, 2017 (KR) ........................ 10-2017-0107512

(51) Int. Cl.
*H01L 21/02* (2006.01)
*C01B 33/12* (2006.01)

(52) U.S. Cl.
CPC .................................. *C01B 33/12* (2013.01)

(58) Field of Classification Search
CPC .... B01J 31/02; B01J 31/0237; B01J 31/0257; B01J 31/0244; B01J 27/08; C01B 33/12; H01L 21/02; H01L 21/02208; H01L 21/02222
See application file for complete search history.

(56) References Cited

U.S. PATENT DOCUMENTS

| | | | |
|---|---|---|---|
| 4,636,440 A | 1/1987 | Jada | |
| 5,116,637 A | 5/1992 | Baney et al. | |
| 5,446,088 A | 8/1995 | Haluska | |
| 6,022,812 A * | 2/2000 | Smith | H01L 21/02216 438/763 |
| 6,048,804 A | 4/2000 | Smith et al. | |
| 6,090,448 A | 7/2000 | Wallace et al. | |
| 6,318,124 B1 | 11/2001 | Rutherford et al. | |
| 6,503,850 B1 * | 1/2003 | Wallace | H01L 21/02282 438/782 |
| 6,558,755 B2 | 5/2003 | Berry, III et al. | |
| 8,030,221 B2 | 10/2011 | Cho et al. | |
| 2003/0062600 A1 | 4/2003 | Wu et al. | |
| 2005/0031791 A1 | 2/2005 | Sasaki et al. | |
| 2007/0148435 A1 | 6/2007 | Meredith et al. | |
| 2009/0087665 A1 | 4/2009 | Suzuki et al. | |
| 2013/0052117 A1 | 2/2013 | Imai et al. | |

FOREIGN PATENT DOCUMENTS

| | | |
|---|---|---|
| CN | 1260763 A | 7/2000 |
| CN | 1285837 A | 2/2001 |
| CN | 1317150 A | 10/2001 |
| JP | 07-097448 A | 4/1995 |
| JP | 10-158012 A | 6/1998 |
| JP | 10-194719 A | 7/1998 |
| JP | 11-250756 A | 9/1999 |
| JP | 2002524849 A | 8/2002 |
| JP | 2003138163 A | 5/2003 |
| JP | 2003-525847 A | 9/2003 |
| JP | 3975612 B2 | 6/2007 |
| JP | 2015003860 A | 1/2015 |
| JP | 2016197725 A | 11/2016 |
| KR | 10-2001-0020287 A | 3/2001 |
| KR | 10-2001-0053433 A | 6/2001 |
| KR | 10-2003-0034054 A | 5/2003 |
| KR | 10-2010-0122848 A | 11/2010 |

OTHER PUBLICATIONS

Technical data sheet for monoethanolamine from Nouryon, Mar. 2019.*
Toshio Tsuchiya et al., "Synthesis of ceramics by sol-gel method, 'Organic-inorganic hybrid ion conductive material,'" Tokyo University of Science, [online], May 21, 2017, (https://web.archive.org/web/20170521154212/www.hst.titech.ac.p/~meb/Ceramics/hybrid/hybrid.htm).

* cited by examiner

*Primary Examiner* — Smita S Patel
(74) *Attorney, Agent, or Firm* — Bryan Cave Leighton Paisner LLP

(57) ABSTRACT

The present application relates to a method for producing a silica film, which includes a step of contacting a silica precursor layer formed of a silica precursor composition having a pH of 5 or less with a Lewis base, where the silica precursor composition includes a silica precursor formed from a silane compound and an acid catalyst. The present application can provide a method capable of forming a silica film having excellent resistance to a vertical load and a tangential load without going through expensive equipment or a high temperature process.

12 Claims, No Drawings

PRODUCTION METHOD OF SILICA FILM

CROSS-REFERENCE TO RELATED APPLICATIONS

This application is a National Stage Application of International Application No. PCT/KR2018/009800 filed on Aug. 24, 2018, which claims the benefit of priority based on Korean Patent Application No. 10-2017-0107512 filed on Aug. 24, 2017, the disclosures of which are incorporated herein by reference in their entirety.

TECHNICAL FIELD

The present application relates to a method for producing a silica film.

BACKGROUND ART

The silica film can be applied to various applications. For example, the silica film can be applied to various optical elements and display devices as an optical film, such as an anti-glare layer (AG), for improving light transmittance or visibility. A measure of replacing a protective film or a glass film in various apparatuses using a high-density and high-hardness silica film can be considered. In order for the silica film to be used in such applications, it needs to have excellent vertical and tangential loads at the same time. However, there is no known method for forming a silica film having such physical properties only by a process which does not use expensive equipment and is also performed at a low temperature.

Technical Problem

The present application relates to a method for producing a silica film. It is one object of the present application to provide a method capable of forming a silica film having desired physical properties including a vertical load and a tangential load, and the like through a low-temperature process without using expensive equipment.

Technical Solution

Among physical properties mentioned in this specification, when the measured temperature and/or pressure affects the physical property value, the relevant physical property means a physical property measured at room temperature and/or normal pressure, unless otherwise specified.

In the present application, the term room temperature is a natural temperature without warming or cooling, which can mean one temperature in a range of about 10° C. to 30° C., for example, a temperature of 25° C. or 23° C. or so. Also, unless otherwise specified, the unit of temperature in the present application is Celsius (° C.).

In the present application, the term normal pressure is a pressure when the pressure is not particularly reduced or increased, which can be 1 atmosphere or so, such as normal atmospheric pressure.

The production method of the present application can comprise a step of contacting a silica precursor layer formed of a silica precursor composition comprising a silica precursor and an acid catalyst with a Lewis base.

In the present application, the term silica precursor composition can mean a composition comprising a silica sol which is a condensate of a silane compound as a raw material of a so-called sol-gel method or an intermediate product during the sol-gel method. Thus, the silica precursor is a composition comprising a silica precursor, where the silica precursor can mean a silane compound, which is the applied raw material, and/or a silica sol formed by condensing the silane compound.

The silica precursor composition of the present application can be a composition obtained by treating a composition containing a silane compound as a raw material with an acid catalyst. Thus, the silica precursor composition can have a pH of at least 5 or less. If the condensation reaction of the raw material is performed using a catalyst so that it has a pH in such a range, it is advantageous to form a silica film having desired physical properties in the following process. In another example, the pH can be 4.5 or less, 4 or less, or 3.5 or less or so, or can be 0 or more, more than 0, 0.5 or more, or 1 or more or so.

The silica precursor can be a product of the hydrolysis/condensation reaction of the silane compound as the raw material. For example, the silica precursor can comprise at least a component represented by Formula 1 below.

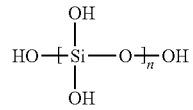

[Formula 1]

In Formula 1, n is an arbitrary number. That is, n is a number determined according to a degree of the silane compound to be hydrolyzed/condensed and thus this can be predicted according to the amount of the applied silane compound and catalyst or the above-mentioned pH range. In one example, n can be a number of about 2 or more, and in another example, n can be a number in a range of about 2 to 10,000,000.

The silica precursor composition can comprise the above-described silica precursor in a range of about 5 to 60 wt %, for example. In another example, the ratio is about 6 wt % or more, 7 wt % or more, 8 wt % or more, 9 wt % or more, 10 wt % or more, 11 wt % or more, 12 wt % or more, 13 wt % or more, 14 wt % or more, 15 wt % or more, 16 wt % or more, 17 wt % or more, 18 wt % or more, 19 wt % or more, 20 wt % or more, 21 wt % or more, 22 wt % or more, 23 wt % or more, 24 wt % or more, 25 wt % or more, 26 wt % or more, 27 wt % or more, 28 wt % or more, 29 wt % or more, 30 wt % or more, 31 wt % or more, 32 wt % or more, 33 wt % or more, 34 wt % or more, 35 wt % or more, 36 wt % or more, 37 wt % or more, 38 wt % or more, or 39 wt % or more, or can also be about 59 wt % or less, 58 wt % or less, 57 wt % or less, 56 wt % or less, 55 wt % or less, 54 wt % or less, 53 wt % or less, 52 wt % or less, 51 wt % or less, 50 wt % or less, 49 wt % or less, 48 wt % or less, 47 wt % or less, 46 wt % or less, 45 wt % or less, 44 wt % or less, 43 wt % or less, 42 wt % or less, 41 wt % or less, 40 wt % or less, about 39 wt % or less, 38 wt % or less, 37 wt % or less, 36 wt % or less, 35 wt % or less, 34 wt % or less, 33 wt % or less, 32 wt % or less, 31 wt % or less, 30 wt % or less, 29 wt % or less, 28 wt % or less, 27 wt % or less, 26 wt % or less, 25 wt % or less, 24 wt % or less, 23 wt % or less, 22 wt % or less, 21 wt % or less, 20 wt % or less, 19 wt % or less, 18 wt % or less, 17 wt % or less, 16 wt % or less, or 15 wt % or less or so.

The ratio of the silica precursor can be a percentage value obtained by calculating the amount of the solid content to be confirmed after drying and dewatering processes of the silica precursor composition in relation to the amount of the composition before the drying and dewatering. In one example, the drying process can proceed at about 80° C. for about 1 hour, and the dewatering process can proceed at about 200° C. for about 24 hours. In another example, the ratio of the silica precursor can be an amount of the silane compound applied to the production of the silica precursor composition.

Hereinafter, the ratio or weight of the silica precursor used in defining the ratio between the components of the silica precursor composition can be based on the ratio or weight of the remaining components after the drying and dewatering processes, or can be the amount of the silane compound applied in the production of the precursor composition.

The silica precursor composition obtained by progressing solation to such a level that the above content can be ensured exhibits appropriate viscosity, whereby it is advantageous in terms of processability and handling properties, minimizes the drying time in the process of forming a silica film and is advantageous in obtaining an object which does not have stains and the like and ensures excellent physical properties such as uniform thickness.

The method of maintaining the content of the silica precursor in the above range is not particularly limited, where the above content can be achieved by controlling the kind of the applied catalyst, the process time and other process conditions in the solation process.

Here, as the silane compound forming the silica sol precursor, an alkoxysilane can be used, and for example, an alkoxysilane having an alkoxy group with 1 to 20 carbon atoms, 1 to 16 carbon atoms, 1 to 12 carbon atoms, 1 to 8 carbon atoms, or 1 to 4 carbon atoms can be used. In one example, as the silane compound, a tetraalkoxysilane, for example, a tetraalkoxysilane in the form that four alkoxy groups each having a carbon number in a range of 1 to 20, 1 to 16, 1 to 12, 1 to 8 or 1 to 4 are bonded to a silicon atom, can be used. Such a compound can be exemplified by tetraethoxysilane (TEOS), tetramethoxysilane (TMOS), methoxytriethoxysilane (MTEOS), methyltrimethoxysilane (MTMS), methyltriethoxysilane (MTES), trimethoxyphenylsilane (TMPS), triethoxyphenylsilane (TEPS), 2-(3,4-epoxycyclohexyl)ethyltrimethoxysilane, 3-glycidoxypropyltrimethoxysilane, vinyltrimethoxysilane, 3-((meth)acryloyloxy)propyltrimethoxysilane and/or 1,2-bis(triethoxysilane) ethane, and the like, but is not limited thereto.

The silica precursor composition can be a composition derived using an acid catalyst. For example, the silica precursor composition can be formed by contacting the silane compound with an appropriate acid catalyst to perform solation. The kind and ratio of the acid catalyst to be used in the above process are not particularly limited and those which can induce a suitable condensation reaction and can ensure the pH in the above-mentioned range can be used.

The applicable acid catalyst can be exemplified by one or a mixture of two or more selected from hydrochloric acid, sulfuric acid, fluorosulfuric acid, nitric acid, phosphoric acid, acetic acid, hexafluorophosphoric acid, p-toluenesulfonic acid and trifluoromethanesulfonic acid, and the like, but is not limited thereto.

The amount of the catalyst used to form the silica precursor composition is not particularly limited, which can be controlled so that the pH of the above-mentioned range can be secured and, if necessary, the silica sol precursor content to be described below can be ensured.

In one example, the acid catalyst can be used so that the silica precursor composition comprises 0.01 to 50 parts by weight of the acid catalyst relative to 100 parts by weight of the silica precursor. In another example, the ratio can be 0.03 parts by weight or more, 0.1 parts by weight or more, 0.5 parts by weight or more, 1 part by weight or more, 5 parts by weight or more, 10 parts by weight or more, 15 parts by weight or more, 20 parts by weight or more, or 25 parts by weight or more, or can also be 45 parts by weight or less, 40 parts by weight or less, 35 parts by weight or less, 30 parts by weight or less, 25 parts by weight or less, 20 parts by weight or less, 15 parts by weight or less, 10 parts by weight or less, 5 parts by weight or less, or 3 parts by weight or less or so.

The silica precursor composition can further comprise optional components in addition to the above components. For example, the silica precursor composition can further comprise a solvent.

As the solvent, for example, a solvent having a boiling point in a range of about 50° C. to 150° C. can be used. Such a solvent can be exemplified by an aqueous solvent such as water or an organic solvent, where the organic solvent can be exemplified by an alcohol, a ketone or an acetate solvent, and the like. An example of the applicable alcohol solvent can be exemplified by ethyl alcohol, n-propyl alcohol, i-propyl alcohol, i-butyl alcohol, n-butyl alcohol and/or t-butyl alcohol, and the like, the ketone solvent can be exemplified by acetone, methyl ethyl ketone, methyl isobutyl ketone, dimethyl ketone, methyl isopropyl ketone and/or acetyl acetone, and the like, and the acetate solvent can be exemplified by methyl acetate, ethyl acetate, propyl acetate and/or butyl acetate, and the like, without being limited thereto.

In one example, the composition can comprise a mixed solvent of an aqueous solvent and an organic solvent, where as the aqueous solvent, water can be used, and as the organic solvent, the alcohol, ketone and/or acetate solvent as described above can be used, but is not limited thereto.

The amount of the solvent in the silica precursor composition is not particularly limited, but for example, a solvent having a number of moles of about 2 times to 8 times relative to the number of moles of the silane compound used as the raw material can be used.

In one example, the silica precursor composition can comprise 40 to 300 parts by weight of a solvent relative to 100 parts by weight of the silica precursor.

In another example, the ratio can be about 45 parts by weight or more, 50 parts by weight or more, 55 parts by weight or more, 60 parts by weight or more, 65 parts by weight or more, 70 parts by weight or more, 75 parts by weight or more, 80 parts by weight, or 85 parts by weight or more, or can also be 250 parts by weight or less, 200 parts by weight or less, 190 parts by weight or less, 180 parts by weight or less, 170 parts by weight or less, 160 parts by weight or less, or 150 parts by weight or less or so.

When a mixture of an aqueous solvent and an organic solvent is used as the solvent, about 5 to 100 parts by weight of an aqueous solvent can be used relative to 100 parts by weight of the organic solvent, without being limited thereto. In another example, the ratio can be about 10 parts by weight or more, 15 parts by weight or more, 20 parts by weight or more, 25 parts by weight or more, or 30 parts by weight or more, or can also be about 95 parts by weight or less or so, 90 parts by weight or less or so, 85 parts by weight or less or so, 80 parts by weight or less or so, 75 parts by weight or less or so, 70 parts by weight or less or so, 65 parts by weight or less or so, 60 parts by weight or less or so, or 55 parts by weight or less or so.

The silica precursor composition can comprise various additives in addition to the above-described components, if necessary, and an example thereof can be exemplified by nanoparticles such as silica, ceria and titania, fluorine-based or silicon-based slip agents and/or drying retardants, and the like. These additives can be optionally added in consideration of the purpose, and the specific kinds and ratios thereof can be adjusted depending on the purpose. However, the silica precursor composition, specifically, the composition before being contacted with a Lewis base can comprise only the above-mentioned acid catalyst as a catalyst, as described below, and may not comprise a base catalyst. That is, the precursor layer in contact with the Lewis base can comprise only the above-mentioned acid catalyst as a catalyst, but may not comprise the base catalyst.

Such a silica precursor composition can be prepared, for example, by contacting the silane compound with an acid catalyst. In one example, the composition can be prepared by mixing the solvent and the silane compound to prepare a silica precursor dispersion, and then adding an acid catalyst to the dispersion.

The types of the silane compound, solvent and acid catalyst applied in the above are the same as described above, and the ratios thereof can be adjusted according to the above-mentioned ranges. In addition, here, in the addition of the acid catalyst, only the acid catalyst itself can also be added to the dispersion, and it can also be added in such a manner that the acid catalyst is mixed with an appropriate solvent and then the mixture is added.

It is also possible to add the above-mentioned arbitrary additives that can be added, for example, nanoparticles such as silica, ceria, titania or zirconia, fluorine-based slip agents and/or silicon-based slip agents and/or drying retardants, and the like can also be added.

The step of forming the silica precursor composition can be performed so that the composition has a pH of 5 or less, as described above.

The step of forming the silica precursor composition through contact between the silane compound and the acid catalyst as above can be performed at a temperature of 80° C. or lower. For example, the step of contacting with the acid catalyst can be performed at a temperature of approximately room temperature to 80° C. or lower.

The step of contacting the silica precursor layer formed of the silica precursor composition formed by the above manner with a Lewis base to be described below is performed. Here, the silica precursor layer can be the above-described silica precursor composition itself, or can be an object formed through predetermined treatment therefrom. For example, the silica precursor layer can be one obtained by drying the silica precursor composition to an appropriate level to remove the solvent.

Such a silica precursor layer can be in a state molded into various forms, and for example, can be one molded in the form of a film.

In one example, the silica precursor layer can be formed by applying the silica precursor composition onto an appropriate base material and drying it. The solvent contained in the composition can be removed to an appropriate level by the drying.

The application can be performed by a suitable coating technique, and can be applied by, for example, a bar coating, a comma coating, a lip coating, a spin coating, a dip coating and/or a gravure coating method, and the like. The coating thickness upon such application can be selected in consideration of the level of the desired silica film.

The conditions in the drying step can be controlled so that the solvent can be removed to a desired level. According to one example, the drying step can be performed at a temperature of approximately 120° C. or lower. In another example, the drying temperature can be performed at about 50° C. or higher, 55° C. or higher, 60° C. or higher, 65° C. or higher, 70° C. or higher, or 75° C. or higher, or can also be performed at about 110° C. or lower, 100° C. or lower, 90° C. or lower, or 85° C. or lower or so. In addition, the drying time can be adjusted in a range of about 30 seconds to 1 hour, and the time can also be 55 minutes or less, 50 minutes or less, 45 minutes or less, 40 minutes or less, 35 minutes or less, 30 minutes or less, 25 minutes or less, 20 minutes or less, 15 minutes or less, 10 minutes or less, 5 minutes or less, or 3 minutes or less or so.

If necessary, any treatment can also be performed after forming the silica precursor layer in the same manner as above and before contacting it with a Lewis base. An example of such treatment can be exemplified by a surface modification step through plasma or corona treatment, and the like, but is not limited thereto.

The specific method of performing the plasma treatment and the corona treatment is not particularly limited, which can be performed by a known method such as a direct method using atmospheric plasma or an indirect method.

Such surface treatment can improve the physical properties of the silica film by increasing the contact efficiency in the contact step with a Lewis base to be described below and improving the base catalytic treatment effect.

Here, the type of the base material to which the silica precursor composition is applied is not particularly limited, and for example, the base material can be a releasable process film from which the silica film is removed after the formation of the silica film, or can also be a base material used together with the silica film. For example, when the silica film is applied to a component of an electronic element, the base material can be a component provided with the silica film.

In particular, in the present application, since all the processes can be performed in a low temperature process, as described below, the base material has a high degree of application freedom, and for example, a polymer base material known to be unsuitable in a high temperature process can also be used. An example of such a base material can be exemplified by a film or the like in which a film of PET (polyethylene terephthalate), PEN (polyethylene naphthalate), PEEK (polyether ether ketone) and PI (polyimide), and the like is in the form of a single layer or a multilayer, but is not limited thereto.

In addition, as the polymer film, for example, a TAC (triacetyl cellulose) film; a COP (cycloolefin copolymer) film such as norbornene derivatives; an acrylic film such as PMMA (poly(methyl methacrylate); a PC (polycarbonate) film; a PE (polyethylene) film; a PP (polypropylene) film; a PVA (polyvinyl alcohol) film; a DAC (diacetyl cellulose) film; a Pac (polyacrylate) film; a PES (polyether sulfone) film; a PEEK (polyetheretherketone) film; a PPS (polyphenylsulfone) film; a PEI (polyetherimide) film; a PEN (polyethylenenaphthalate) film; a PET (polyethyleneterephtalate) film; a PI (polyimide) film; a PSF (polysulfone) film; a PAR (polyarylate) film or a fluororesin film can also be applied.

If necessary, the base material can also be subjected to suitable surface treatment.

The base material can also be an appropriate functional film, for example, an optical functional film such as a retardation film, a polarizing film, a brightness enhancement film, or a high refractive index or low refractive index film, if necessary.

In the present application, a silica precursor layer formed through the above steps can be contacted with a Lewis base to form a silica film. The term Lewis base means a material capable of imparting a non-covalent electron pair, as is known.

In the present application, a silica film having desired physical properties even at a low temperature can be formed by contacting the above-mentioned specific silica precursor composition with a Lewis base to be subjected to gelation and forming a silica film.

The method of contacting the silica precursor layer with the Lewis base is not particularly limited. For example, a method of immersing the silica precursor layer in the Lewis base, or coating, spraying and/or dropping the Lewis base on the silica precursor layer, and the like can be applied.

As the Lewis base, a base having a pKa of 8 or less can be used. Through the gelation using such a pKa, a silica film having physical properties according to the purpose can be formed. In another example, the pKa can be 7.5 or less, 7 or less, 6.5 or less, 6 or less, 5.5 or less, 5 or less, 4.5 or less, or about 4 or less, or can be about 1 or more, 1.5 or more, 2 or more, 2.5 or more, or 3 or more or so.

As the Lewis base, a base having a boiling point in a range of 80° C. to 500° C. can be used. In another example, the boiling point can be 90° C. or higher, 100° C. or higher, 110° C. or higher, 120° C. or higher, 130° C. or higher, 140° C. or higher, 150° C. or higher, 160° C. or higher, 170° C. or higher, 180° C. or higher, 190° C. or higher, 200° C. or higher, 210° C. or higher, 220° C. or higher, 230° C. or higher, 240° C. or higher, 250° C. or higher, 260° C. or higher, 270° C. or higher, 280° C. or higher, 290° C. or higher, 300° C. or higher, 310° C. or higher, 320° C. or higher, 330° C. or higher, 340° C. or higher, or 350° C. or higher, or can also be 1,000° C. or lower, 900° C. or lower, 800° C. or lower, 700° C. or lower, 600° C. or lower, 500° C. or lower, 400° C. or lower, or 300° C. or lower or so.

The Lewis base can have a flash point of 80° C. or higher. In another example, the flash point can be 90° C. or higher, 100° C. or higher, 110° C. or higher, 120° C. or higher, 130° C. or higher, 140° C. or higher, 150° C. or higher, or 155° C. or higher, or can also be 600° C. or lower, 500° C. or lower, 300° C. or lower, 200° C. or lower, 190° C. or lower, 180° C. or lower, or 170° C. or lower or so.

As the Lewis base, a base having a room temperature vapor pressure of 10,000 Pa or less can be used. In another example, the room temperature vapor pressure can be 9,000 Pa or less, 8,000 Pa or less, 7,000 Pa or less, 6,000 Pa or less, 5,000 Pa or less, 4,000 Pa or less, 3,000 Pa or less, 2,000 Pa or less, 1,000 Pa or less, 900 Pa or less, 800 Pa or less, 700 Pa or less, 600 Pa or less, 500 Pa or less, 400 Pa or less, 300 Pa or less, 200 Pa or less, 100 Pa or less, 90 Pa or less, 80 Pa or less, 70 Pa or less, 60 Pa or less, 50 Pa or less, 40 Pa or less, 30 Pa or less, 20 Pa or less, 10 Pa or less, 9, 8 Pa or less, 7 Pa or less, 6 Pa or less, 5 Pa or less, 4 Pa or less, 3 Pa or less, 2 Pa or less, 1 Pa or less, 0.9 Pa or less, 0.8 Pa or less, 0.7 Pa or less, 0.6 Pa or less, 0.5 Pa or less, 0.4 Pa or less, 0.3 Pa or less, 0.2 Pa or less, 0.1 Pa or less, 0.09 Pa or less, 0.08 Pa or less, 0.07 Pa or less, 0.06 Pa or less, 0.05 Pa or less, 0.04 Pa or less, 0.03 Pa or less, 0.02 Pa or less, 0.01 Pa or less, 0.009 Pa or less, 0.008 Pa or less, 0.007 Pa or less, 0.006 Pa or less, 0.005 Pa or less, 0.004 Pa or less, or 0.003 Pa or less, or can be 0.0001 Pa or more, 0.0002 Pa or more, 0.0003 Pa or more, 0.0004 Pa or more, 0.0005 or more, 0.0006 Pa or more, 0.0007 Pa or more, 0.0008 Pa or more, 0.0009 Pa or more, 0.001 Pa or more, 0.0015 Pa or more, or 0.002 Pa or more or so.

In one example, the Lewis base can be in a liquid phase at a temperature of 120° C. or 120° C. or lower.

In one example, the Lewis base can be applied on its own, and can be applied in admixture with an aqueous solvent, such as water, or an organic solvent. For example, when the Lewis base is in a solid phase at a temperature of 120° C. or lower, it can be used by being dissolved in an aqueous or organic solvent. Here, the usable organic solvent can be exemplified by any one or more of N,N-dimethylacetamide (DMAc), N-methylpyrrolidone (NMP), N,N-dimethylformamide (DMF), 1,3-dimethyl-2-imidazolidinone, N,N-diethylacetamide (DEAc), N,N-dimethylmethoxyacetamide, dimethylsulfoxide, pyridine, dimethylsulfone, hexamethylphosphoramide, tetramethylurea, N-methylcaprolactam, tetrahydrofuran, m-dioxane, p-dioxane, 1,2-dimethoxyethane, bis(2-methoxyethyl)ether, 1,2-bis(2-(methoxyethoxy)ethane, bis[2-(2-methoxyethoxy)]ether, poly(ethylene glycol)methacrylate (PEGMA), gamma-butyrolactone (GBL), and Equamide (Equamide M100, Idemitsu Kosan Co., Ltd), but is not limited thereto.

By performing gelation by contacting the Lewis base having characteristics as described above with the above-mentioned specific silica precursor composition, the silica film of the desired physical properties can be effectively obtained.

In addition, the Lewis base having such physical properties is thermally stable, has a low risk of fire, and also has a secondary advantage of reducing odor and explosion risk due to low vapor pressure. In one example, as the catalyst contacting the silica precursor layer in the gelation step, that is, the contact step with the Lewis base, only the Lewis base can be applied.

The Lewis base can be used without particular limitation as long as it has the above-mentioned characteristics, and in one example, an amine compound or a phosphate compound can be applied.

For example, as the amine compound, a compound represented by any one of Formulas 2 to 5 below can be used.

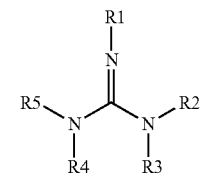

[Formula 2]

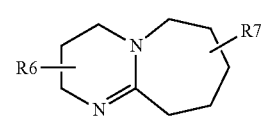

[Formula 3]

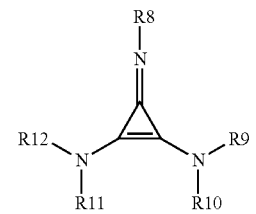

[Formula 4]

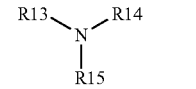

[Formula 5]

In Formulas 2 to 5, $R_1$ to $R_{15}$ can each independently be hydrogen or an alkyl group.

Here, the alkyl group can be a linear, branched or cyclic alkyl group having 1 to 20 carbon atoms, 1 to 16 carbon atoms, 1 to 15 carbon atoms, 1 to 12 carbon atoms, 1 to 8 carbon atoms or 1 to 4 carbon atoms, or having 4 to 20 carbon atoms, 6 to 20 carbon atoms, 8 to 20 carbon atoms, 4 to 16 carbon atoms, 6 to 16 carbon atoms, 8 to 16 carbon atoms, 4 to 12 carbon atoms, 6 to 12 carbon atoms, or 8 to 10 carbon atoms.

In one example, the alkyl group can also optionally be substituted with any substituent.

The amine compound can also be any one of Formulas 2-1, 3-1, 4-1 and 5-1 below.

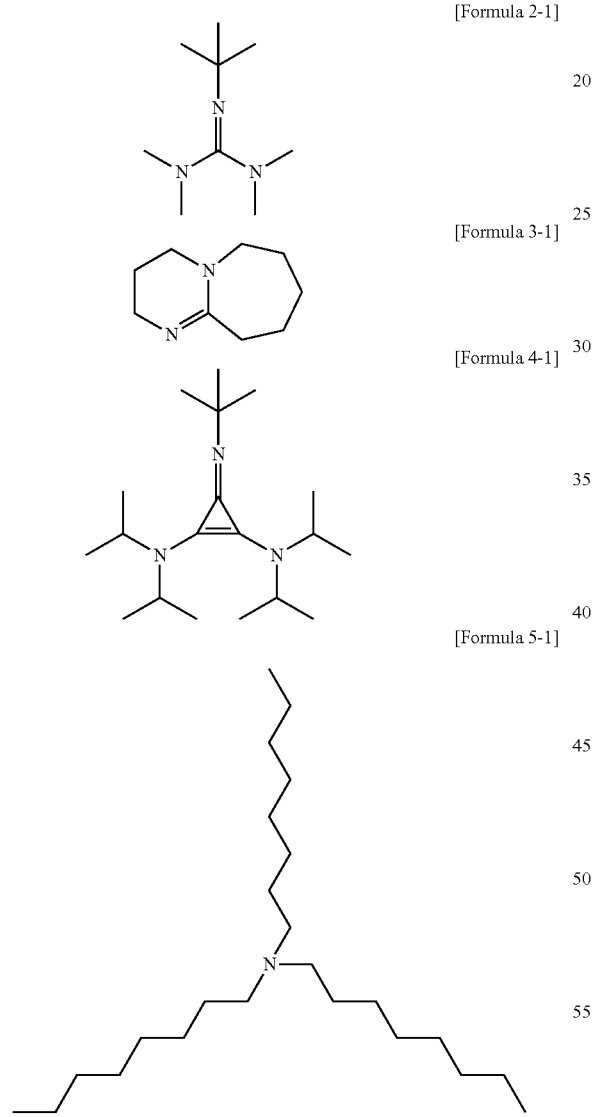

In a suitable example, the amine compound can be a compound wherein $R_{13}$ to $R_{15}$ in Formula 5 are each an alkyl group. Here, the alkyl group can be a linear, branched or cyclic alkyl group having 1 to 20 carbon atoms, 1 to 16 carbon atoms, 1 to 15 carbon atoms, 1 to 12 carbon atoms, 1 to 8 carbon atoms or 1 to 4 carbon atoms, or having 4 to 20 carbon atoms, 6 to 20 carbon atoms, 8 to 20 carbon atoms, 4 to 16 carbon atoms, 6 to 16 carbon atoms, 8 to 16 carbon atoms, 4 to 12 carbon atoms, 6 to 12 carbon atoms or 8 to 10 carbon atoms.

As the phosphate compound, any one compound of Formulas 6 to 10 below can be exemplified.

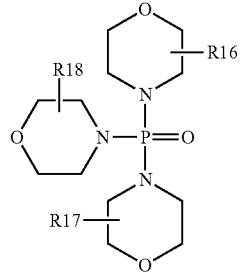

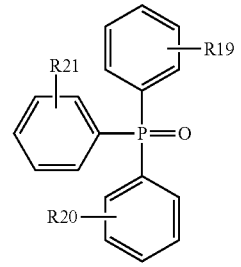

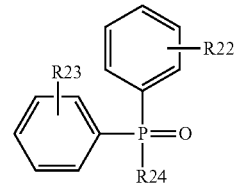

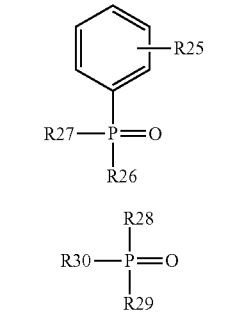

In Formulas 6 to 10, $R_{16}$ to $R_{29}$ are each independently hydrogen; or an alkyl group.

Here, the alkyl group can be a linear, branched or cyclic alkyl group having 1 to 20 carbon atoms, 1 to 16 carbon atoms, 1 to 15 carbon atoms, 1 to 12 carbon atoms, 1 to 8 carbon atoms or 1 to 4 carbon atoms, or having 4 to 20 carbon atoms, 6 to 20 carbon atoms, 8 to 20 carbon atoms, 4 to 16 carbon atoms, 6 to 16 carbon atoms, 8 to 16 carbon atoms, 4 to 12 carbon atoms, 6 to 12 carbon atoms or 8 to 10 carbon atoms.

In one example, the alkyl group can also optionally be substituted with any substituent.

In one example, as the phosphate compound, any compound of Formulas 6-1, 7-1, 8-1, 9-1 and 10-1 can also be used.

[Formula 6-1]
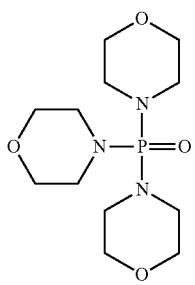

[Formula 7-1]
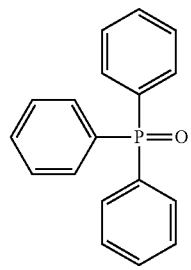

[Formula 8-1]
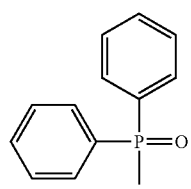

[Formula 9-1]
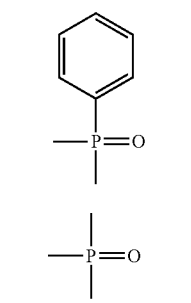

[Formula 10-1]
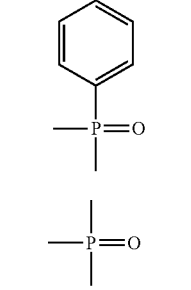

The gelation or curing reaction of the silica precursor layer can be induced by the contact with the Lewis base as above.

Such gelation or curing can proceed even in a low temperature condition and can proceed effectively without any special separate treatment to form a silica film of the desired physical properties.

In one example, the gelation or curing reaction, that is, the contact with the Lewis base can be performed at a low temperature, for example, about 120° C. or lower or so. In one example, the contact can be performed at 110° C. or lower, 100° C. or lower, 90° C. or lower, or 85° C. or lower and can also be performed at 60° C. or higher, 65° C. or higher, 70° C. or higher, or 75° C. or higher or so.

In the present application, a silica film can be formed in the same manner as above. In the present application, another additional process such as an optional cleaning process can also be performed after forming the silica film in this manner.

In one example, the present application can perform all processes as low temperature processes. That is, all processes of the present application can be performed under the temperature of the low temperature process to be described below. In the present application, the term low temperature process means a process having a process temperature of about 350° C. or lower, about 300° C. or lower, about 250° C. or lower, about 200° C. or lower, about 150° C. or lower, or about 120° C. or lower. In the production process of the silica film of the present application, all the processes can be performed in the above temperature range.

Since the present application can form a silica film having desired physical properties, for example, a high-density and high-hardness silica film effectively even by the low temperature process as above, for example, a silica film having desired physical properties can be formed in large quantities by a continuous and inexpensive process, and the silica film can also be formed directly and effectively on a base material which is weak against heat, such as a polymer film. The lower limit of the process temperature in the low temperature process is not particularly limited, and for example, the low temperature process can be performed at about 10° C. or higher, 15° C. or higher, 20° C. or higher, or 25° C. or higher.

Advantageous Effects

The present application can provide a method capable of forming a silica film having excellent required physical properties including resistance to a vertical load and a tangential load, and the like in large quantities without going through expensive equipment or a high temperature process. The production method of the present application is also suitable for application of a mass production process such as a roll-to-roll process, and is also suitable for forming a desired silica film directly on a base material, which has weak heat resistance, such as a polymer film, since it goes through no high temperature process. The silica film formed by this method of the present application can be applied to various applications including an application to replace the glass film.

MODE FOR INVENTION

Hereinafter, the scope of the present application will be described in more detail by way of examples, but the scope of the present application is not limited by the following examples.

Example 1

208 g of TEOS (tetraethoxy silane) and 184 g of ethanol were mixed in a flask and stirred for about 10 minutes. Subsequently, an acidic solution prepared by mixing 2.4 g of hydrochloric acid and 72 g of water ($H_2O$) was added in drops thereto to adjust the pH to about 1, and the mixture was stirred at room temperature for about 3 days to form a silica precursor composition. The silica precursor composition was applied on a glass substrate by a bar coating method to a thickness of about 10 μm or so and dried at 80° C. for about 1 minute. After drying, the layer of the silica precursor composition was subjected to atmospheric pressure plasma treatment, and then immersed in trioctylamine (TOA) maintained at a temperature of 80° C. or so (pKa: 3.5, boiling point: about 366° C., flash point: about 163° C., room temperature vapor pressure: about 0.002 Pa) for about 5 minutes or so to form a silica film. The formed silica film was washed with flowing water at about 60° C. for about 2 minutes and dried in an oven at about 80° C. for 1 minute.

Example 2

208 g of TEOS (tetraethoxy silane) and 184 g of ethanol were mixed in a flask and stirred for about 10 minutes. Subsequently, an acidic solution prepared by mixing 0.1 g of hydrochloric acid and 72 g of water ($H_2O$) was added in drops thereto to adjust the pH to about 3, and the mixture was stirred at a temperature of 70° C. or so for about 3 days to form a silica precursor composition. Using the prepared silica precursor composition, a silica film was formed in the same manner as in Example 1.

Example 3

208 g of TEOS (tetraethoxy silane) and 184 g of ethanol were mixed in a flask and stirred for about 10 minutes. Subsequently, an acidic solution prepared by mixing 19.6 g of sulfuric acid ($H_2SO_4$) and 36 g of water ($H_2O$) was added in drops thereto to adjust the pH to about 1, and the mixture was stirred at room temperature for about 3 days to form a silica precursor composition. Using the prepared silica precursor composition, a silica film was formed in the same manner as in Example 1.

Example 4

208 g of TEOS (tetraethoxy silane) and 184 g of ethanol were mixed in a flask and stirred for about 10 minutes. Subsequently, an acidic solution prepared by mixing 60 g of acetic acid ($CH_3COOH$) and 72 g of water ($H_2O$) was added in drops thereto to adjust the pH to about 3, and the mixture was stirred at room temperature for about 3 days to form a silica precursor composition. Using the prepared silica precursor composition, a silica film was formed in the same manner as in Example 1.

Example 5

208 g of TEOS (tetraethoxy silane) and 240 g of isopropanol were mixed in a flask and stirred for about 10 minutes. Subsequently, an acidic solution prepared by mixing 2.4 g of hydrochloric acid and 72 g of water ($H_2O$) was added in drops thereto to adjust the pH to about 1, and the mixture was stirred at room temperature for about 3 days to form a silica precursor composition. Using the prepared silica precursor composition, a silica film was formed in the same manner as in Example 1.

Example 6

240 g of TEOS (tetraethoxy silane) and 138 g of ethanol were mixed in a flask and stirred for about 10 minutes. Subsequently, an acidic solution prepared by mixing 2.4 g of hydrochloric acid and 72 g of water ($H_2O$) was added in drops thereto to adjust the pH to about 1, and the mixture was stirred at room temperature for about 3 days to form a silica precursor composition. Using the prepared silica precursor composition, a silica film was formed in the same manner as in Example 1.

Test Example 1

The surface hardness of the silica films of Examples 1 to 6 in the plane direction was confirmed by a steel wool test and the surface hardness in the thickness direction was confirmed by a pencil hardness test. The steel wool test was measured by rubbing the surface of the silica film ten times with a #0 steel wool at 25° C. and 50% relative humidity, and increasing the steel wool load in stages until the occurrence of defects such as scratches was confirmed on the surface of the silica film. The results of the steel wool test described in Table 1 below are loads that no defect of the silica film occurs.

The pencil hardness test was measured by a method of drawing a pencil lead over the surface of the sample at an angle of 45 degrees while applying a force of 1 kg at 25° C. and 50% relative humidity. It was measured by increasing the hardness of the pencil lead in stages until the occurrence of defects such as indentation, scratching or rupture was confirmed on the surface of the silica film. The result of the pencil hardness test, the pencil hardness that the above defects did not occur, was shown in Table 1 below.

TABLE 1

| | Steel Wool Test | Pencil Hardness Test |
|---|---|---|
| Example 1 | 1.5 Kg | 9 H |
| Example 2 | 1.5 Kg | 9 H |
| Example 3 | 1.2 Kg | 9 H |
| Example 4 | 1.0 Kg | 8 H |
| Example 5 | 1.3 Kg | 9 H |
| Example 6 | 800 g | 7 H |

The invention claimed is:

1. A method for producing a silica film comprising:
   a step of contacting a silica precursor layer formed of a silica precursor composition having a pH of 5 or less, with a Lewis base to conduct a gelation to obtain the silica film, wherein the silica precursor composition comprises a silica precursor formed from a silane compound and an acid catalyst,
   wherein the Lewis base has a pKa of 4.5 or less,
   wherein the Lewis base has a boiling point in a range of 350° C. to 1000° C., and
   wherein the method is performed at 150° C. or less.

2. The method for producing a silica film according to claim 1, wherein the silica precursor in the silica precursor composition comprises a component of Formula 1:

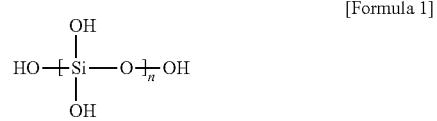

[Formula 1]

wherein, n is a number of 2 or more.

3. The method for producing a silica film according to claim 1, wherein the silica precursor is included in the silica precursor composition in an amount of 5 to 60 wt %.

4. The method for producing a silica film according to claim 1, wherein the acid catalyst is one or more selected from the group consisting of a hydrochloric acid, a sulfuric acid, a fluorosulfuric acid, a nitric acid, a phosphoric acid, a hexafluorophosphoric acid, a p-toluenesulfonic acid and a trifluoromethanesulfonic acid.

5. The method for producing a silica film according to claim 1, wherein the silica precursor composition comprises 0.01 to 10 parts by weight of the acid catalyst relative to 100 parts by weight of the silica precursor in the silica precursor composition.

6. The method for producing a silica film according to claim 1, wherein the silica precursor composition further comprises a solvent.

7. The method for producing a silica film according to claim 6, wherein the silica precursor composition comprises 40 to 300 parts by weight of the solvent relative to 100 parts by weight of the silica precursor in the silica precursor composition.

8. The method for producing a silica film according to claim 6, wherein the solvent is a mixed solvent of water and one or more solvents selected from the group consisting of alcohol, ketone and acetate solvents.

9. The method for producing a silica film according to claim 8, wherein the solvent comprises 5 to 100 parts by weight of water relative to 100 parts by weight of the one or more solvents selected from the group consisting of alcohol, ketone and acetate solvents.

10. The method for producing a silica film according to claim 1, wherein the Lewis base has a flash point of 80° C. or higher.

11. The method for producing a silica film according to claim 1, wherein the Lewis base has a room temperature vapor pressure of 10,000 Pa or less.

12. The method for producing a silica film according to claim 1, wherein the Lewis base is an amine compound or a phosphate compound.

* * * * *